United States Patent
Gil et al.

(10) Patent No.: US 8,192,544 B2
(45) Date of Patent: Jun. 5, 2012

(54) APPARATUS FOR MANUFACTURING POLY CRYSTALINE SILICON INGOT FOR SOLAR BATTERY HAVING DOOR OPEN/CLOSE DEVICE USING HINGE

(75) Inventors: Jong-Won Gil, Seongnam-si (KR); Sang-Jin Moon, Daejeon (KR); Won-Wook So, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 643 days.

(21) Appl. No.: 12/245,727

(22) Filed: Oct. 4, 2008

(65) Prior Publication Data
US 2009/0090296 A1 Apr. 9, 2009

(30) Foreign Application Priority Data
Oct. 5, 2007 (KR) .................. 10-2007-0100570

(51) Int. Cl.
*C30B 13/28* (2006.01)
*C30B 15/30* (2006.01)
(52) U.S. Cl. ............ 117/202; 117/74; 117/83; 117/200; 117/204; 373/140; 373/163; 373/165
(58) Field of Classification Search .................. 117/74, 117/83, 200, 202, 204; 373/140, 163, 165
See application file for complete search history.

(56) References Cited

U.S. PATENT DOCUMENTS
5,735,951 A * 4/1998 Iino et al. ............. 117/217
6,063,188 A * 5/2000 Heid ..................... 117/200

FOREIGN PATENT DOCUMENTS
JP 11092284 A * 4/1999
JP 2003165716 A * 6/2003
* cited by examiner Primary Examiner — Jerry Lorengo
Assistant Examiner — Ross J Christie
(74) Attorney, Agent, or Firm — Sherr & Vaughn, PLLC

(57) ABSTRACT

Disclosed herein is an apparatus for manufacturing a polycrystalline silicon ingot for solar batteries having a door control device using a hinge. The apparatus includes a vacuum chamber, a crucible, a susceptor which surrounds the crucible, a heater which heats the crucible, and an insulation plate which is disposed below the susceptor and has an opening therein. The apparatus further includes a cooling plate which moves upwards through the opening of the insulation plate and comes into close contact with or approaches the lower end of the susceptor, a cooling plate moving unit which actuates the cooling plate, a temperature sensor which measures the temperature of the crucible, and a control unit which controls the temperature in the crucible and the cooling plate moving unit. Furthermore, a door is provided on the insulation plate to open or close the opening of the insulation plate. The hinge is provided between the door and the insulation plate. Thus, after the raw silicon material is melted, when the cooling plate moves upwards to cool the crucible and thus pushes the lower surface of the door upwards, the door is opened by the hinge in a swinging manner, and when the cooling plate approaches or comes into contact with the lower end of the susceptor, one end of the opened door is leaned on a corresponding surface of the cooling plate.

8 Claims, 13 Drawing Sheets

APPARATUS FOR MANUFACTURING POLY CRYSTALINE SILICON INGOT FOR SOLAR BATTERY HAVING DOOR OPEN/CLOSE DEVICE USING HINGE

The present application claims priority to Korean Patent Application No. 10-2007-100570 (filed on Oct. 5, 2007), which is hereby incorporated by reference in their entireties.

BACKGROUND OF THE INVENTION

1. Field of the Invention

The present invention relates generally to apparatuses for manufacturing polycrystalline silicon ingots for solar batteries and, more particularly, to an apparatus for manufacturing a polycrystalline silicon ingot for solar batteries which has a door control device using a hinge and is constructed such that silicon which has been melted in a crucible is cooled from the bottom of the crucible to the top thereof.

2. Description of the Related Art

Recently, solar energy generation using silicon solar batteries has been continuously developed owing to its providing various advantages such as being non-pollutive, safe and reliable and has already reached a commercialization stage beyond the experimental stage.

In several countries, for example, the U.S.A, Japan and Germany, solar energy generation of a capacity of several hundreds through several thousands of Kw is being implemented using silicon solar batteries.

At present, solar batteries which are used for solar energy generation are manufactured using a single crystalline silicon film formed by the Czochralski method. However, to continuously produce large quantities of solar batteries through mass production, the cost of manufacturing silicon films will have to be reduced and the productivity will have to increase. Because of such a background, a casting method was proposed in an effort to reduce the cost of manufacturing silicon films for solar batteries.

The manufacture of a polycrystalline silicon ingot for solar batteries using the casting method is characterized by directional solidification.

In detail, after polycrystalline silicon substances are charged into a crucible made of quartz or graphite and are melted, the heat of solution of silicon is removed from the lower portion of the crucible such that the cooling solidification progresses from the lower portion of the crucible to the upper portion thereof. Thus, an ingot having a constant orientation, i.e. an ingot having a columnar structure, is obtained.

Compared to a single crystalline silicon ingot manufactured by the Czochralski method, a polycrystalline silicon ingot manufactured by the above-mentioned method induces a reduction in electric efficiency when manufacturing a solar battery because of grain boundaries formed in the ingot. In addition, because crystals have columnar structures in the direction in which the crystals are grown, general physical properties of the polycrystalline silicon ingot are about 20% lower than that of the single crystalline silicon ingot. However, the casting method of manufacturing the polycrystalline silicon ingot can be easily adapted for mass production (of two or three times larger than that of the Czochralski method of manufacturing the single crystalline silicon ingot) and has superior productivity (two or three times greater than that of the Czochralski method). As well, the method of manufacturing the polycrystalline silicon ingot is relatively simple. Owing to these advantages, the cost of manufacturing the polycrystalline silicon ingot is about ⅓ to ½ of that of the single crystalline silicon ingot.

In typical casting methods known to date, polycrystalline silicon is previously melted in a polycrystalline silicon melting part made of quartz before it is supplied into a graphite crucible. After the melting, the melted polycrystalline silicon is supplied into the rectangular or cylindrical graphite crucible, the entire height of which is maintained at a temperature ranging from 600° C. to 1200° C. Subsequently, a crystal growing process is conducted, thus forming a polycrystalline silicon ingot.

In the case of the above-mentioned conventional casting methods, because cooling solidification rapidly progresses, solidified silicon is prevented from adhering to the crucible. However, there are disadvantages in that contamination of silicon attributable to the crucible is induced, and because heat stress remains, defect concentration is increased and crystal grains are relatively small.

SUMMARY OF THE INVENTION

Accordingly, the present invention has been made keeping in mind the above problems occurring in the prior art, and an object of the present invention is to provide an apparatus for manufacturing a polycrystalline silicon ingot for solar batteries which has a door control device using a hinge and is constructed such that silicon crystals are evenly grown from the bottom of a crucible to the top thereof.

The present invention improves a technique proposed in Korean Patent Application No. 2007-6218, which was filed by the applicant of the present invention on Jan. 19, 2007 and entitled 'Apparatus for manufacturing a polycrystalline silicon ingot for solar batteries'. The present invention is constructed such that a door can be opened without using a separate motor, thus solving problems (noise occurrence, complex structure of the apparatus) that are induced by the use of the motor.

In order to accomplish the above object, the present invention provides an apparatus for manufacturing a polycrystalline silicon ingot for solar batteries having a door control device using a hinge, the apparatus including: a vacuum chamber; a crucible provided in the vacuum chamber, the crucible having a predetermined shape; a susceptor for surrounding the crucible to protect the crucible; a support provided under the susceptor to support the susceptor; a heater to heat the crucible to melt a raw silicon material in the crucible; an insulation plate disposed below the susceptor at a position spaced apart by a predetermined distance from the susceptor, with an opening being formed through the insulation plate; a cooling plate having a diameter corresponding to a diameter of the opening of the insulation plate, the cooling plate moving upwards through the opening of the insulation plate and coming into close contact with or approaching a lower end of the susceptor to cool a lower end of the crucible; a cooling plate support shaft provided under the cooling plate to support the cooling plate; a cooling plate moving unit to actuate the cooling plate and the cooling plate support shaft; an inert gas supply and discharge unit to supply inert gas into the vacuum chamber or discharge the inert gas to an outside of the vacuum chamber; a temperature sensor to measure a temperature of the crucible; and a control unit to control the temperature in the crucible using an output value transmitted from the temperature sensor such that the raw silicon material is evenly melted and grown in the crucible, the control unit controlling the inert gas supply and discharge unit such that a constant amount of inert gas is maintained in the vacuum chamber, the control unit controlling the cooling plate moving unit such that the cooling plate approaches or comes into contact with the lower end of the susceptor through the opening of the insulation plate, wherein a door is provided on the insulation plate to open or close the opening of the insulation plate, with the hinge provided between the door and the insulation plate such that the door is opened or closed by the hinge, so that after the raw silicon material is melted, when the cooling plate moves upwards to cool the crucible and thus pushes a lower surface of the door upwards, the door is opened by the hinge in a swinging manner, and when the cooling plate approaches or comes into contact with the lower end of the susceptor, one end of the opened door is leaned on a corresponding surface of the cooling plate.

The apparatus may further include a scratch prevention unit for preventing a scratch from being induced on contact surfaces between the cooling plate and the door when the cooling plate moves upwards and pushes the lower surface of the door.

Preferably, the scratch prevention unit may comprise a roller provided on a surface of the cooling plate which comes into contact with the lower surface of the door, so that when the cooling plate moves upwards and pushes the lower surface of the door to open the door, the roller rolls on the lower surface of the door.

The door may comprises two or more (for example, four) doors. In the case where the four doors are provided on the opening of the insulation plate, the roller which is the scratch prevention unit may also comprise four rollers provided at positions corresponding to the respective doors on the surface of the cooling plate which comes into contact with the doors.

The crucible may be disposed at the center of the vacuum chamber, and the opening of the insulation plate may be disposed directly below the susceptor.

Preferably, a refrigerant passage may be formed in the cooling plate and the cooling plate support shaft.

BRIEF DESCRIPTION OF THE DRAWINGS

The above and other objects, features and advantages of the present invention will be more clearly understood from the following detailed description taken in conjunction with the accompanying drawings, in which:

FIGS. 1A through 1C are partially broken perspective views of an apparatus for manufacturing a polycrystalline silicon ingot for solar batteries, according to a first embodiment of the present invention, in which FIG. 1A illustrates an initial state, FIG. 1B illustrates a cooling plate which approaches lower surfaces of the doors, and FIG. 1C illustrates the cooling plate which approaches (or comes into contact with) a crucible and a susceptor after the doors have been opened;

FIG. 3A through 3C are partially broken perspective views of an apparatus for manufacturing a polycrystalline silicon ingot for solar batteries, according to a second embodiment of the present invention, in which FIG. 3A illustrates an initial state, FIG. 3B illustrates a cooling plate which approaches the lower surfaces of the doors, and FIG. 3C illustrates the cooling plate which approaches (or comes into contact with) a crucible and a susceptor after the doors have been opened;

DESCRIPTION OF THE PREFERRED EMBODIMENTS

Hereinafter, preferred embodiments of the present invention will be described in detail with reference to the attached drawings.

Figure 1A:
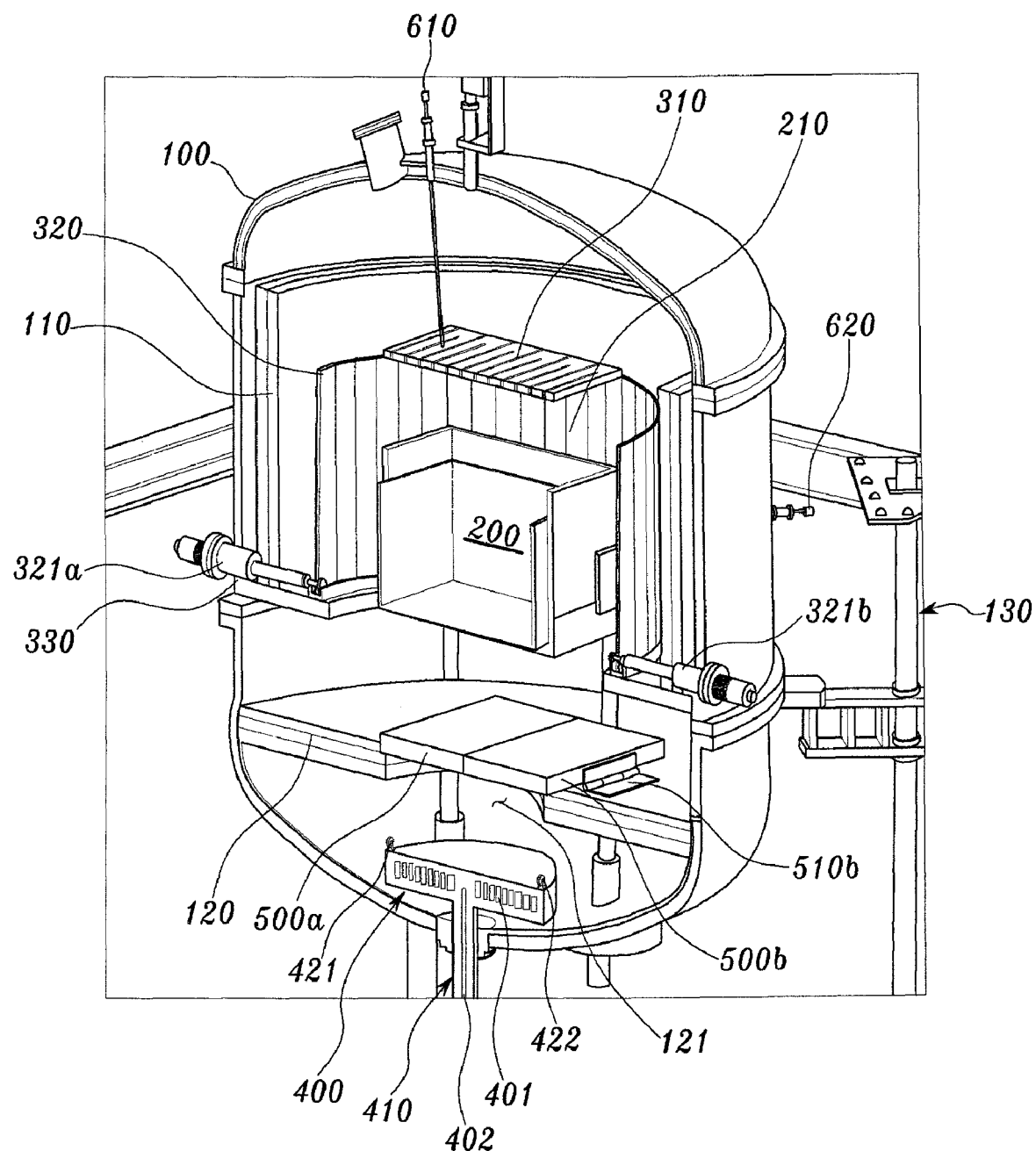
Figure 1B:
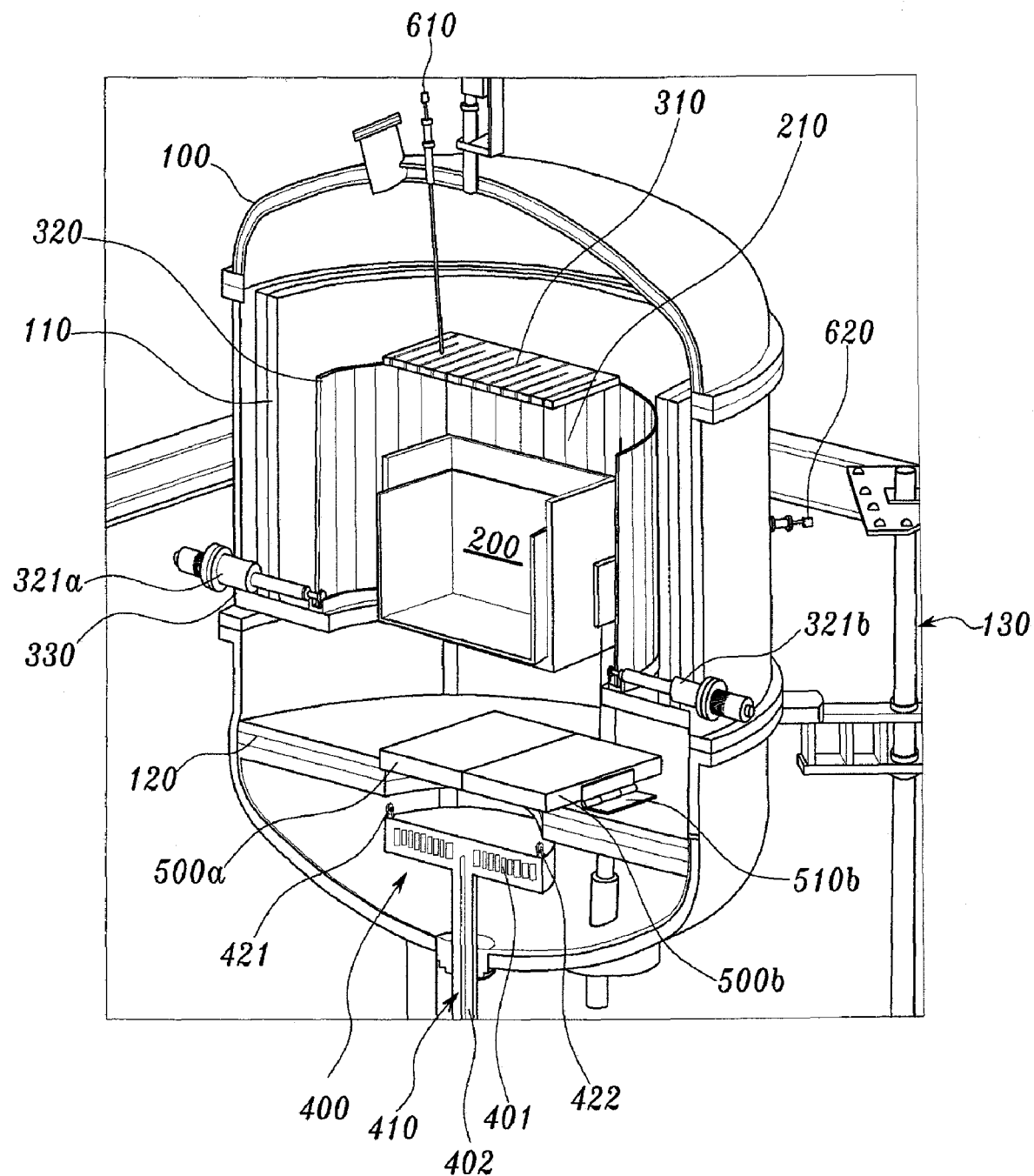
Figure 1C:
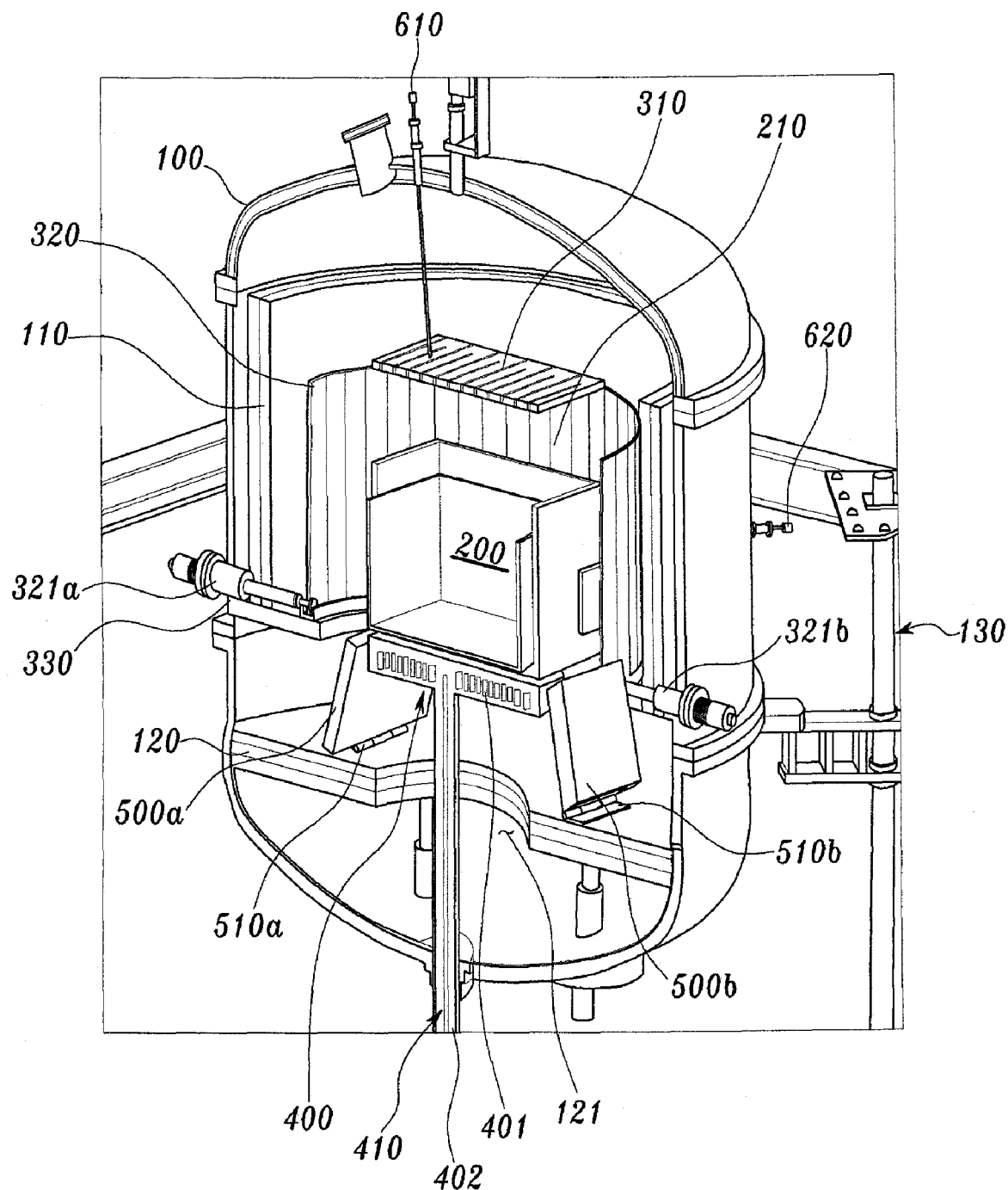

FIGS. 1A through 1C are partially broken perspective views of an apparatus for manufacturing a polycrystalline silicon ingot for solar batteries, according to a first embodiment of the present invention, in which FIG. 1A illustrates an initial state, FIG. 1B illustrates a cooling plate 400 which approaches lower surfaces of the doors, and FIG. 1C illustrates the cooling plate 400 which approaches (or comes into contact with) a crucible 200 and a susceptor 210 after the doors are opened.

Referring to the drawings, the apparatus for manufacturing a polycrystalline silicon ingot for solar batteries according to the first embodiment of the present invention includes a vacuum chamber 100, the crucible 200, the susceptor 210, heaters 310 and 320, doors 500a and 500b, the cooling plate 400, temperature sensors 610 and 620 and a control unit (not shown).

The vacuum chamber 100 has a hollow space therein. Most components of the apparatus of the present invention are installed in the vacuum chamber 100.

In the drawings, the reference numeral 130 denotes a member, which is provided around the vacuum chamber 100 to hold and support the vacuum chamber 100.

As shown in the drawings, the crucible 200 preferably has a cube shape and is made of quartz.

Furthermore, it is preferable that the crucible 200 be disposed at the center of the vacuum chamber 100.

In addition, the crucible 200 is open on the upper end thereof. A separate cover (not shown) may be provided on the open upper end of the crucible 200 to openably close it.

In the present invention, raw silicon (Si) material is input into the crucible 200.

The susceptor 210 is provided around the outer surface of the crucible 200. The susceptor 210 functions to protect the crucible 200.

The susceptor 210 is preferably open on the upper end thereof, in the same manner as that of the crucible 200. Bar-shaped supports 211 for supporting the susceptor 210 are provided under the four respective corners of the susceptor 210.

The susceptor 210 is preferably made of carbon or graphite which has high heat transfer efficiency.

In the present invention, the heaters 310 and 320 are respectively provided above and around the susceptor 210. Of course, a heater may be provided under the susceptor 210, but in the first embodiment of the present invention, the heaters 310 and 320 are respectively provided only above and around the susceptor 210. The reason for this is that only the heaters 310 and 320, which are provided above and around the susceptor 210, are sufficient to melt raw silicon material in the crucible 200.

The heaters 310 and 320 melt raw silicon material in the crucible 200, as stated above. The melting point of raw silicon material is about 1420° C.

As methods of controlling power for the heaters 310 and 320, for example, there are a method of controlling a duty ratio of voltage pulses applied to the heaters 310 and 320 or a method of controlling the periods of voltage pulses applied to the heaters 310 and 320.

Here, of course, the temperature in the apparatus is measured by the temperature sensors 610 and 620.

The apparatus of the present invention includes the temperature sensors 610 and 620. As one example of their configuration, the temperature sensors 610 and 620 may be attached to the heater 310 or the crucible 200.

In the drawings, the reference numerals 321a and 321b denote electrodes for applying power to the heaters 310 and 320. The reference numeral 330 denotes a heater support plate for supporting the heaters 310 and 320 thereon, and 110 denotes an insulator.

In the present invention, an insulation plate 120 which has an opening 121 is provided below the susceptor 210 at a position spaced apart from the lower end of the susceptor 210 by a predetermined distance. The opening 121 serves as a passage, through which the cooling plate 400 which will be explained later herein moves.

Preferably, the opening 121 is disposed directly below the susceptor 210. Owing to this structure, the cooling plate 400 can easily approach the lower end of the susceptor 210 after passing through the opening 121.

The doors 500a and 500b are attached to the upper surface of the insulation plate 120 and function to openably close the opening 121, which is formed through the insulation plate 120. In other words, when it is desired to seal the space in the vacuum chamber to melt raw silicon material, the doors 500a and 500b are closed. When the cooling plate 400 is moved upwards and enters the vacuum chamber, the doors 500a and 500b are opened.

A method of opening or closing the doors 500a and 500b will be described in detail later herein.

The cooling plate 400 has a size corresponding to the size of the opening 121 of the insulation plate 120. When it is desired to cool the crucible 200, the cooling plate 400 approaches or comes into close contact with the lower end of the susceptor 210 and cools the crucible 200.

A cooling plate support shaft 410 for supporting the cooling plate 400 thereon is provided under the cooling plate 400.

The movement of the cooling plate 400 is realized by a cooling plate moving unit (for example, a motor, but not shown). Here, as well as having vertical movement (z-axial movement), the cooling plate 400 may have six degrees of freedom in movement (x-axial, y-axial, z-axial, pitching, yawing and rolling movements).

In the present invention, refrigerant passages 401 and 402 are respectively formed in the cooling plate 400 and the cooling plate support shaft 410. Refrigerant (for example, water) moves along the refrigerant passages 401 and 402, thereby cooling the cooling plate 400, and the cooled cooling plate 400 consequently slowly cools the crucible 200 which has been heated.

The above-mentioned components of the apparatus of the present invention are controlled by the control unit (not shown).

In detail, the control unit receives output values from the temperature sensors 610 and 620 and controls the temperature in the crucible 200 such that silicon is melted in the crucible 200 and crystals are evenly grown in the crucible 200. Furthermore, the control unit functions to control the cooling plate moving unit such that the cooling plate 400 correctly approaches or comes into contact with the lower end of the susceptor 210 through the opening 121 of the insulation plate 120.

Moreover, under the control of the control unit, the cooling plate moving unit may move the susceptor 210 and the crucible 200 which are brought into contact with the cooling plate 400.

As well, the control unit controls the flow rate and the temperature of refrigerant.

Meanwhile, the polycrystalline silicon ingot manufacturing apparatus of the present invention further includes an inert gas supply unit, which supplies inert gas into the vacuum chamber, but this is not shown in the drawings.

Furthermore, the present invention is provided with an inert gas discharge unit which discharges inert gas to the outside of the vacuum chamber.

Here, argon (Ar) is a representative example of the inert gas.

The inert gas supply unit is controlled by the control unit, whereby inert gas is supplied into the vacuum chamber by the inert gas supply unit before the step of melting raw silicon material using the heaters is conducted, but this will be explained later.

Next, the method of opening/closing the doors 500a and 500b will be explained.

There may be various methods of opening/closing the doors 500a and 500b, but the first embodiment of the present invention is constructed such that the doors 500a and 500b are opened or closed using hinges 510a and 510b, which are respectively provided between the doors 500a and 500b and the insulation plate 120.

In detail, the two hinges 510a and 510b are respectively provided between the two doors 500a and 500b and the insulation plate 120. When the cooling plate 400 is moved upwards to cool the crucible 200 after raw silicon material has melted, the cooling plate 400 pushes the lower surfaces of the doors 500a and 500b upwards. At this time, the two doors 500a and 500b are rotated around the hinges 510a and 510b and are thus opened in a double swinging manner. Furthermore, when the cooling plate 400 approaches or comes into close contact with the lower end of the susceptor 210 to cool the crucible 200, the open doors 500a and 500b are leaned on the corresponding surfaces of the cooling plate 400 (see, FIG. 1C).

The present invention further includes a unit for preventing scratches from being induced on contact surfaces between the cooling plate 400 and the doors 500a and 500b when the cooling plate 400 pushes the doors 500a and 500b and moves upwards.

For example, the scratch prevention unit may comprise rollers 421 and 422. In this case, the rollers 421 and 422 are provided on the corresponding surface of the cooling plate 400 which comes into contact with the lower surfaces of the doors 500a and 500b. Therefore, in the present invention, when the cooling plate 400 which moves upwards pushes the lower surfaces of the doors 500a and 500b, the rollers 421 and 422 respectively roll on the lower surfaces of the doors 500a and 500b, thus preventing a scratch from being induced by a contact between the doors 500a and 500b and the cooling plate 400.

Figure 2A:
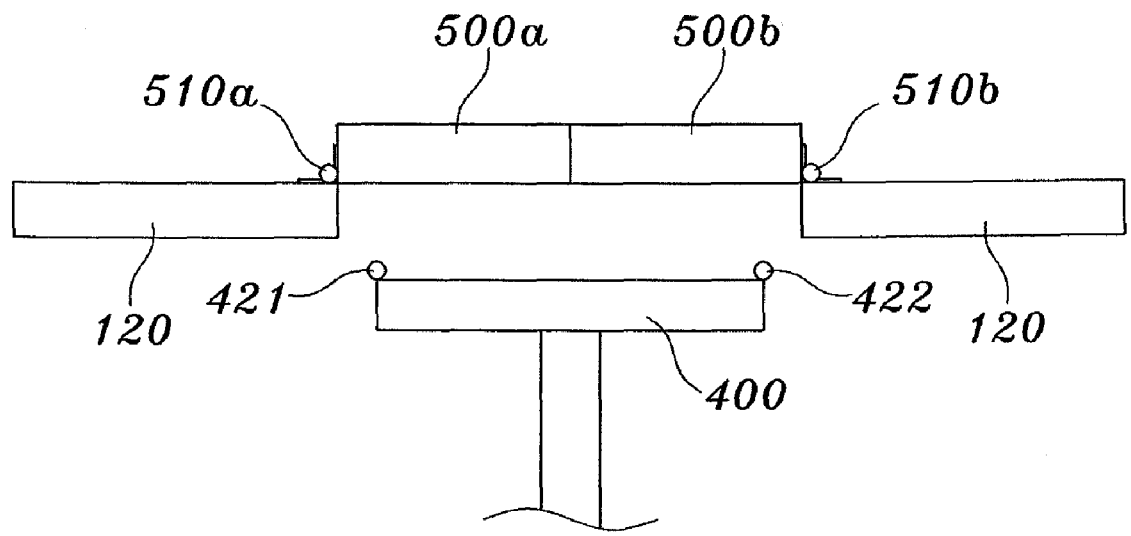
FIGS. 2A and 2B are views showing a critical part of the apparatus according to the first embodiment of the present invention.
Figure 2B:
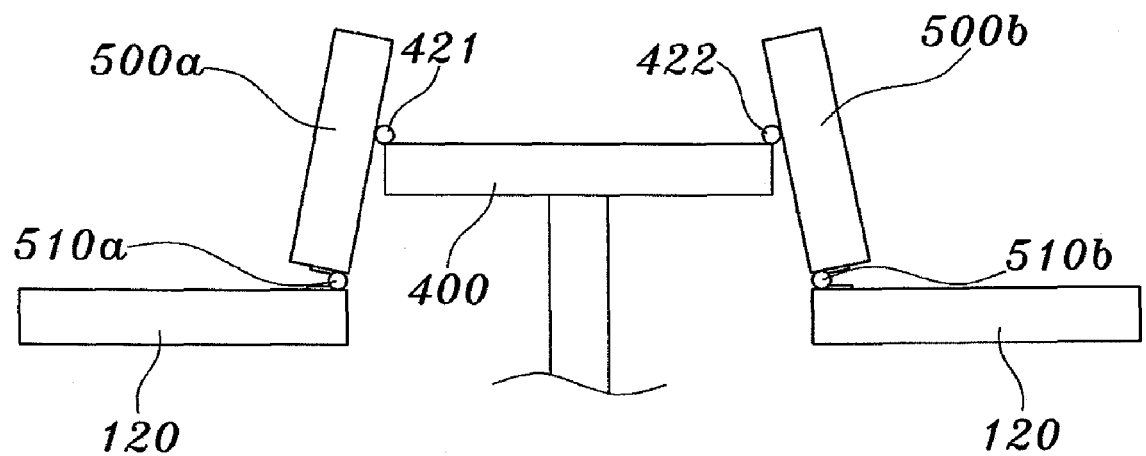

FIGS. 2A and 2B are views illustrating a critical part of the polycrystalline silicon ingot manufacturing apparatus according to the first embodiment of the present invention, in which FIG. 2A is a view illustrating the critical part of the apparatus in the state of FIG. 1A, and FIG. 2B is a view illustrating the critical part of the apparatus in the state of FIG. 1C.

Referring to the drawings, in the first embodiment of the present invention, the two doors 500a and 500b symmetrically face each other and are opened upwards or closed downwards in the double swinging manner, as stated above. The doors 500a and 500b are respectively opened or closed using the hinges 510a and 510b, which are provided between the doors 500a and 500b and the insulation plate 120. Furthermore, the rollers 421 and 422 are provided on the corresponding surface of the cooling plate 400 which comes into contact with the lower surfaces of the doors 500a and 500b. Owing to the installation of the rollers 421 and 422, when the cooling plate 400 pushes the lower surfaces of the doors 500a and 500b and moves upwards, a scratch caused by contact being made between the cooling plate 400 and the doors 500a and 500b can be prevented.

Although the first embodiment of the present invention has been illustrated as having the two doors which are opened or closed in the double swinging manner, this is not to be construed as limiting the present invention. For example, as shown in FIGS. 3 and 4, four or more doors may be used.

Figure 3A:
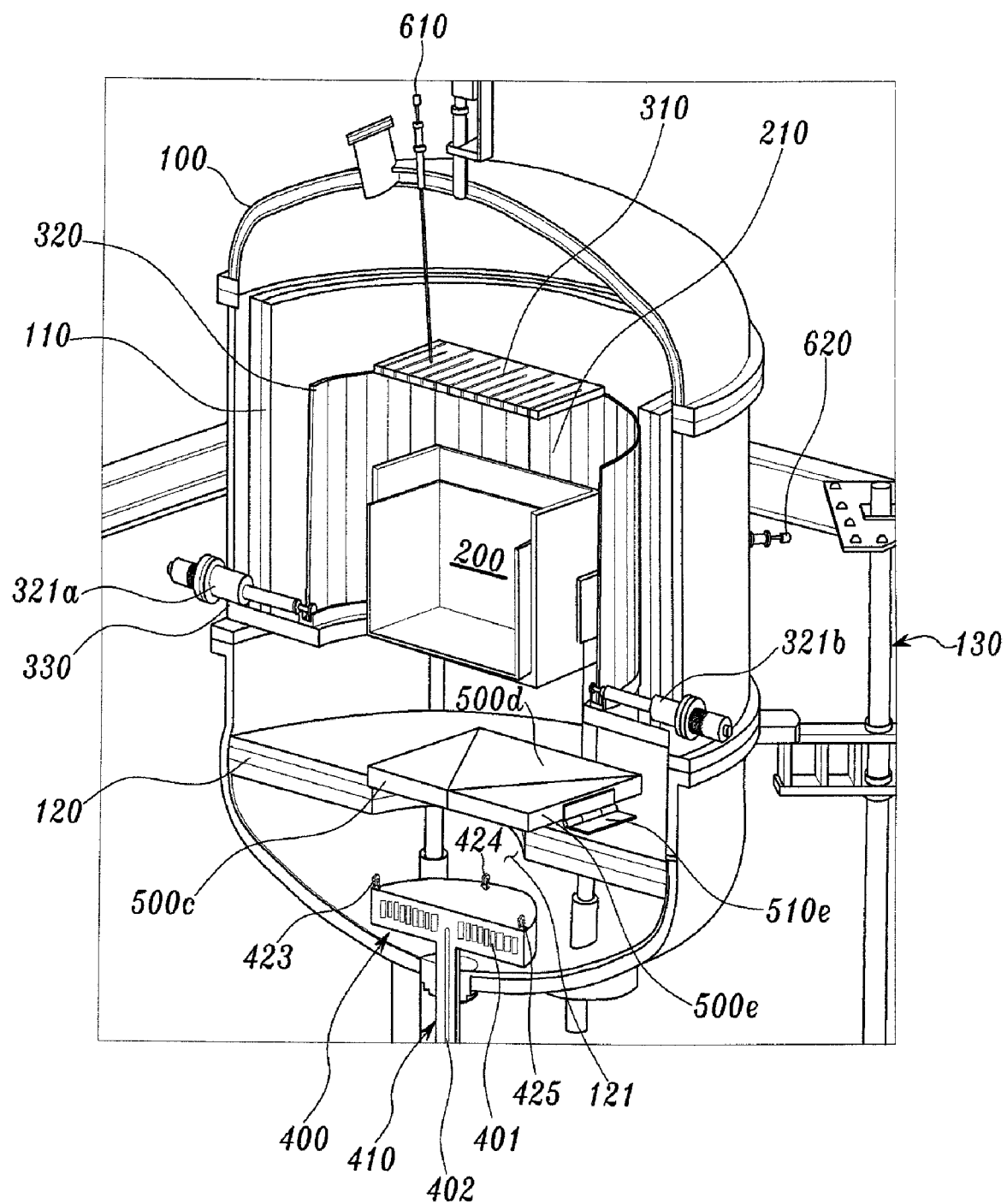
Figure 3B:
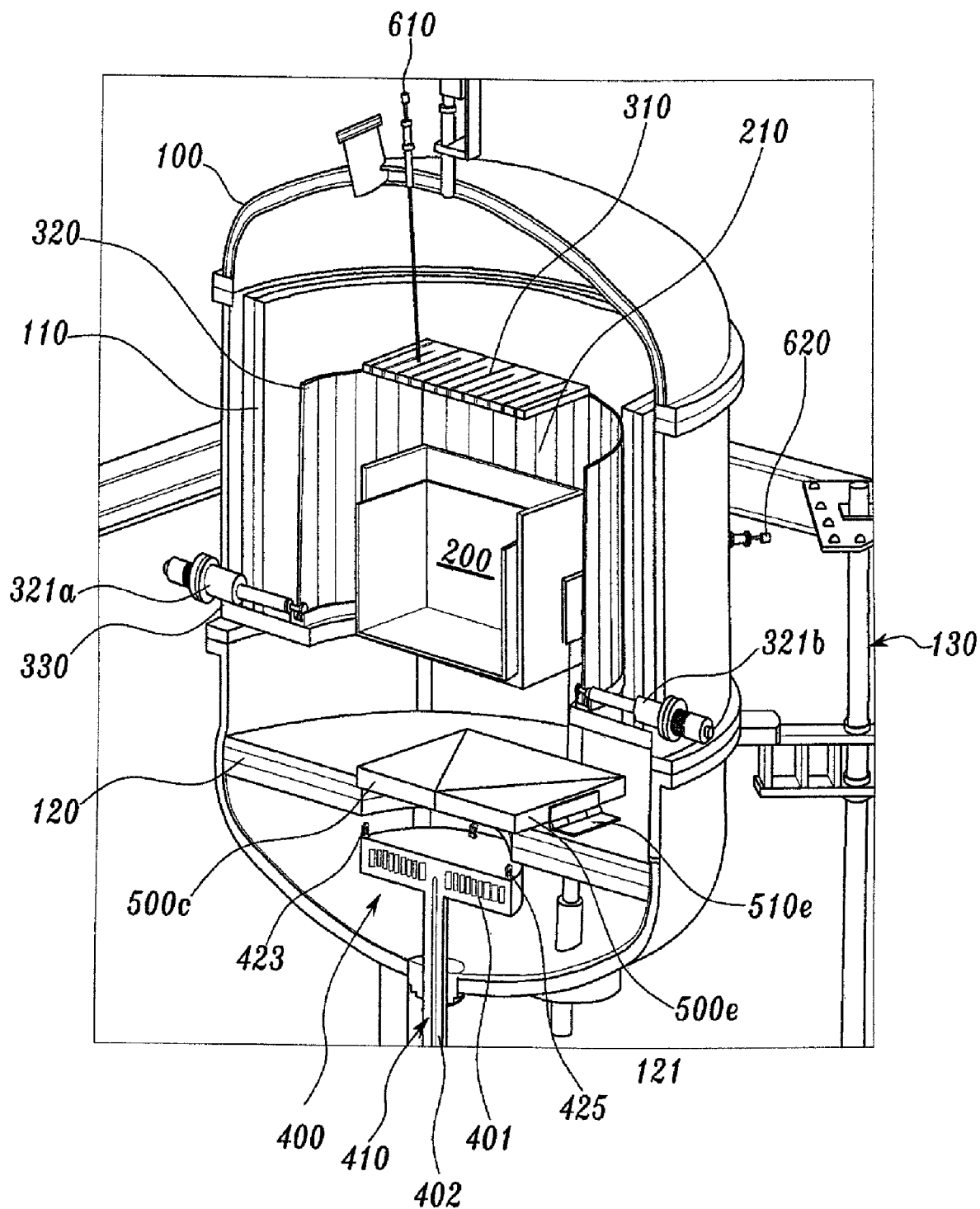
Figure 3C:
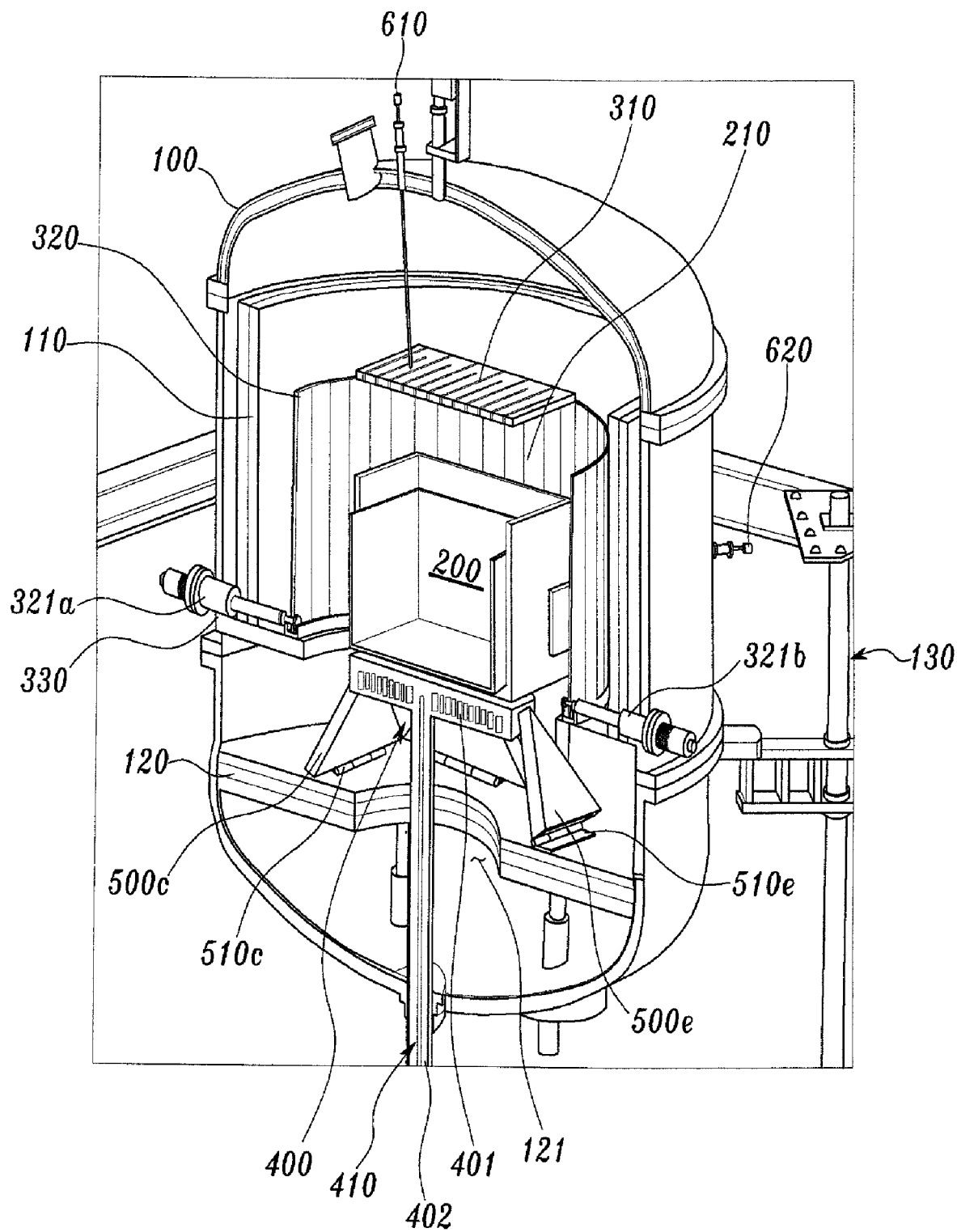
Figure 4A:
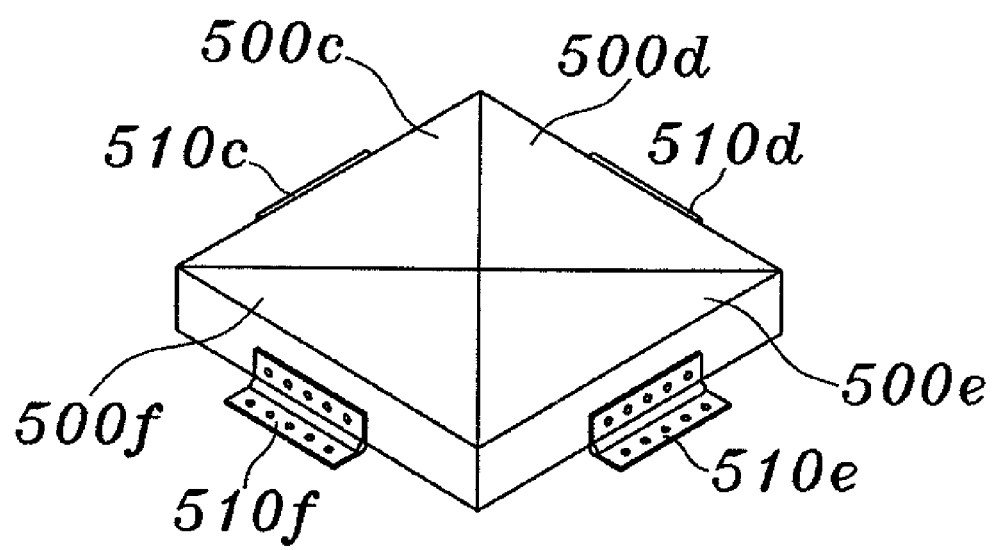
FIGS. 4A and 4B are views illustrating a critical part of the apparatus according to the second embodiment of the present invention.
Figure 4A:
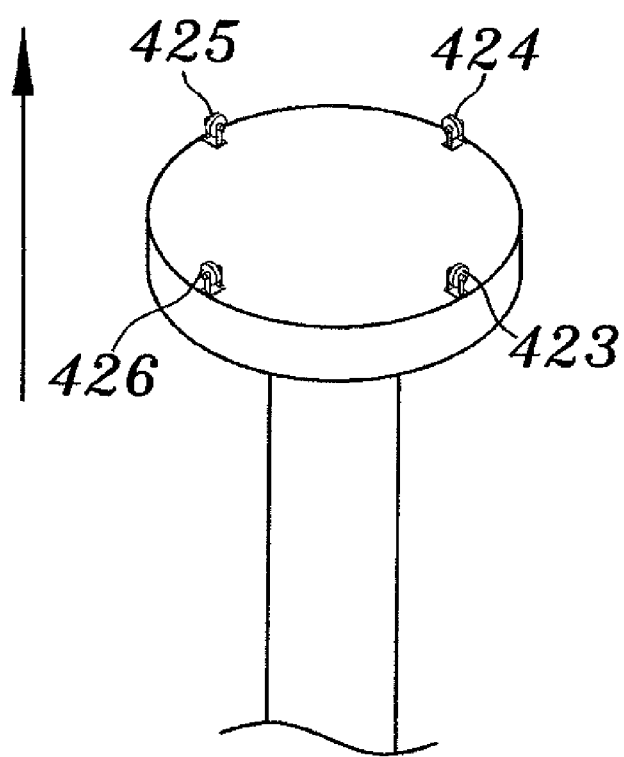
Figure 4B:
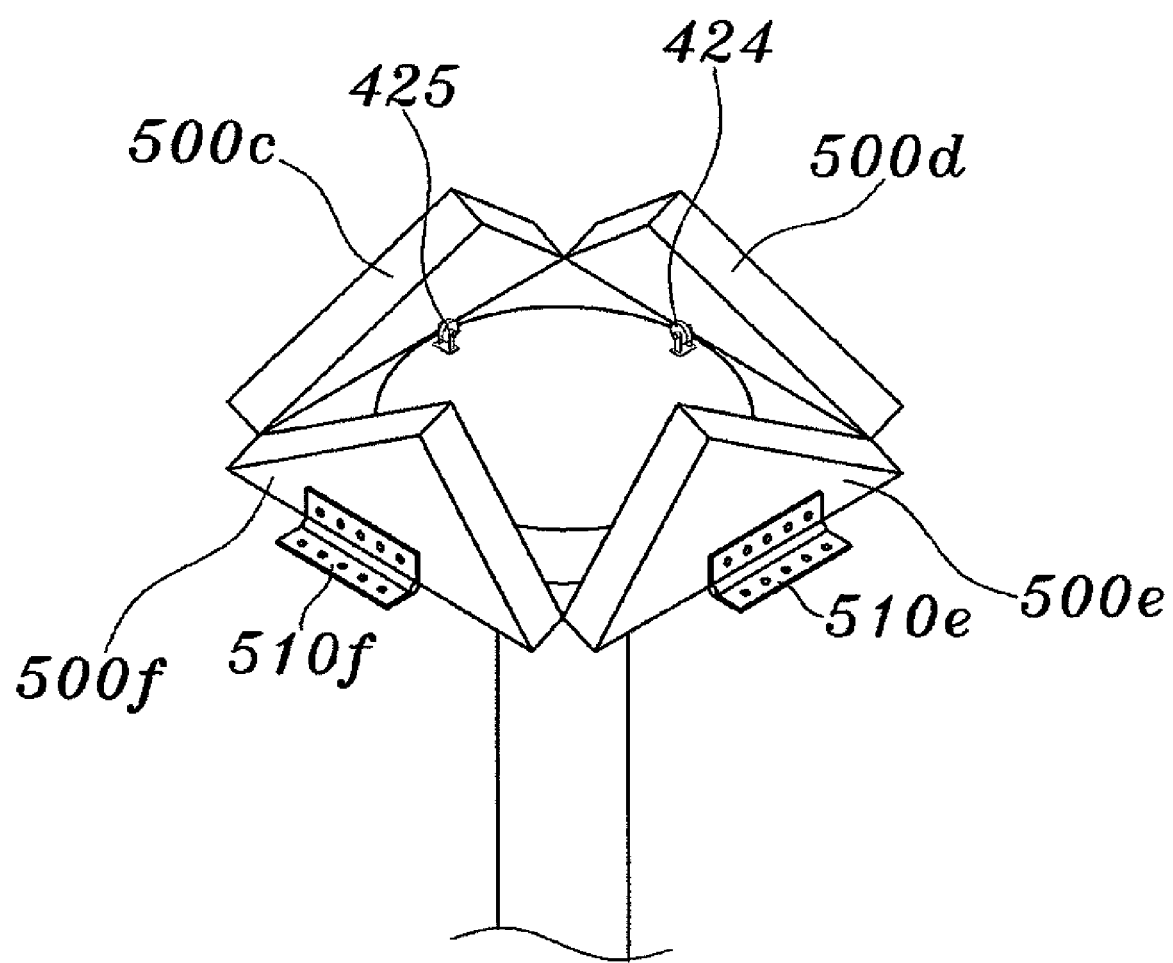

FIG. 3A through 3C are partially broken perspective views of an apparatus for manufacturing a polycrystalline silicon ingot for solar batteries, according to a second embodiment of the present invention, in which FIG. 3A shows an initial state, FIG. 3B shows a cooling plate 400 which approaches lower surfaces of the doors, and FIG. 3C shows the cooling plate 400 which approaches (or comes into contact with) a crucible 200 and a susceptor 210 after the doors have been opened. FIGS. 4A and 4B are views illustrating a critical part of the polycrystalline silicon ingot manufacturing apparatus according to the second embodiment of the present invention.

As shown in the drawings, the polycrystalline silicon ingot manufacturing apparatus according to the second embodiment of the present invention is characterized in that four doors are provided on an insulation plate 120 to openably close an opening 121 formed through the insulation plate 120. Furthermore, in this embodiment, four hinges 510c, 510d, 510e and 510f are respectively provided between the doors 500a, 500b, 500c and 500d and the insulation plate 120. In addition, in response to the number of doors 500c, 500d, 500e and 500f, rollers in multiples of four (for example, four rollers, eight rollers, etc.) are provided on the cooling plate 400. In the second embodiment, four rollers 421, 422, 423 and 424 are respectively provided on the four doors 500c, 500d, 500e and 500f.

The general construction of the apparatus according to the second embodiment except for the number of doors and rollers remains the same as the first embodiment of FIGS. 1 and 2, therefore further explanation is deemed unnecessary.

Figure 5A:
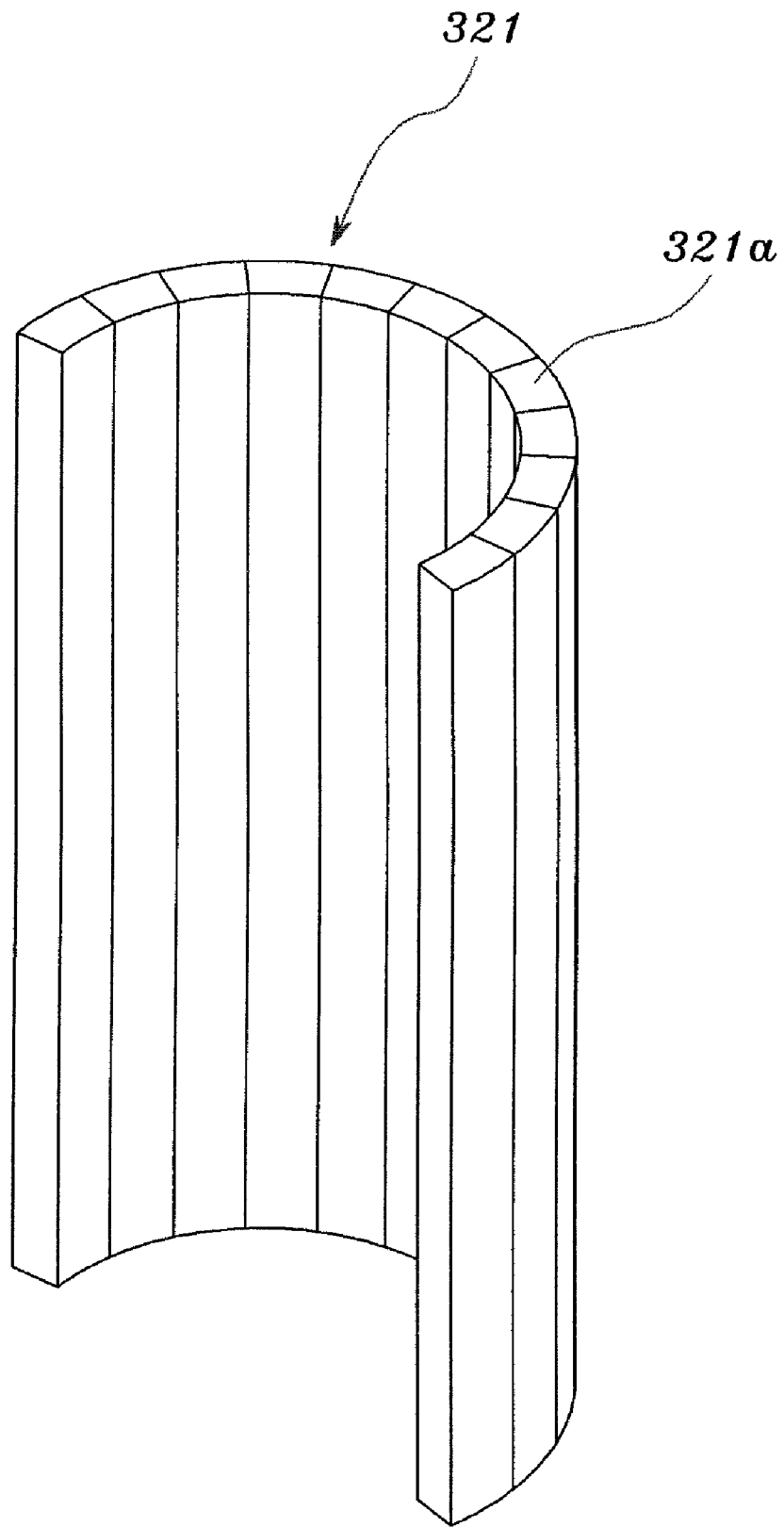
FIGS. 5A through 5C are views of partially broken perspective views showing several examples of a heater which surrounds the crucible and the susceptor according to the present invention.
Figure 5B:
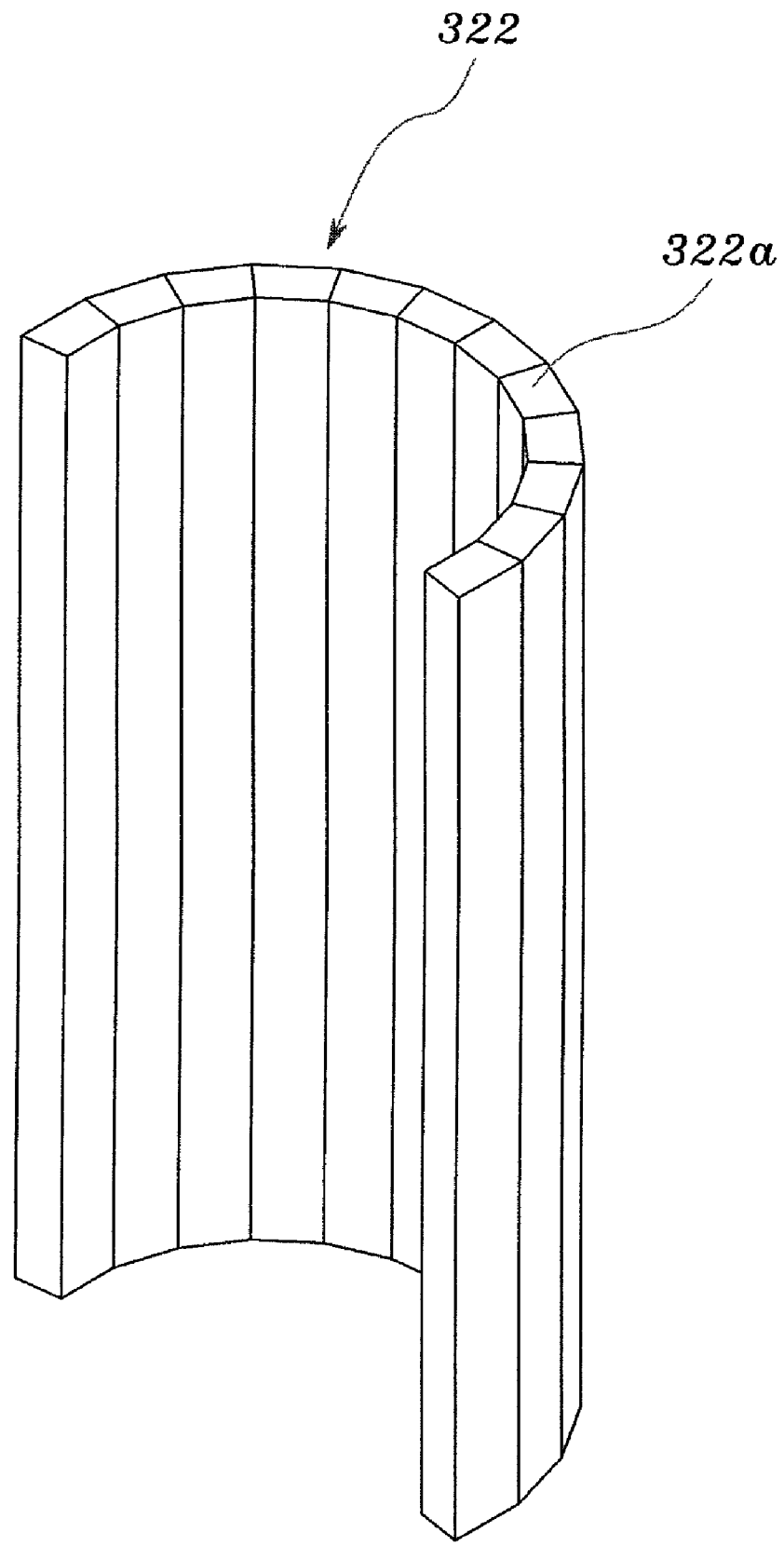
Figure 5C:
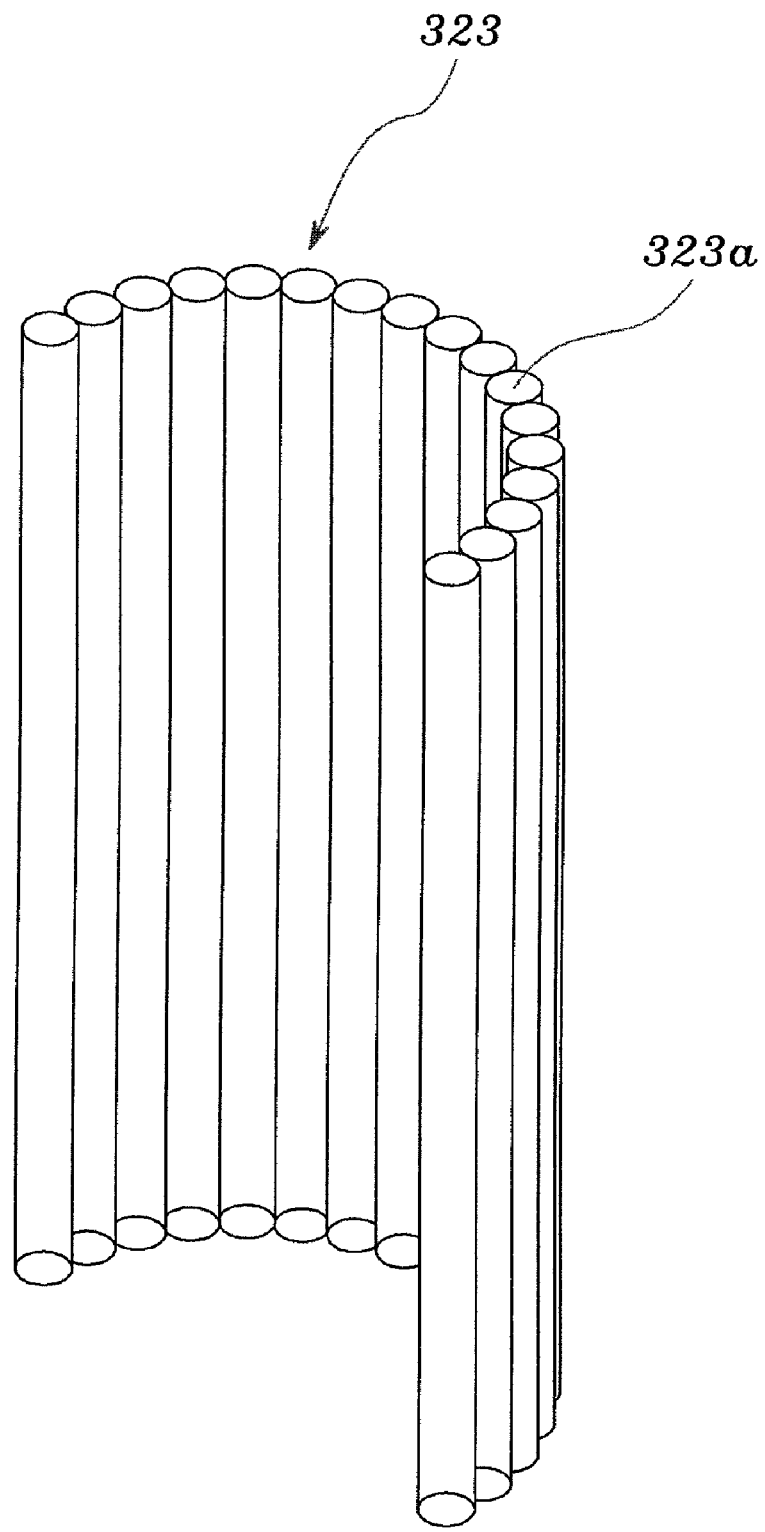

FIGS. 5A through 5C are views of partially broken perspective views showing several examples of the heater which surrounds the crucible 200 and the susceptor 210 according to the present invention.

Referring to FIG. 5A, according to a first example, a heater 321 which surrounds the crucible 200 and the susceptor 210 comprises a plurality of heating elements 321a, which are coupled to each other and have a cylindrical shape. Each heating element 321a has a curvature corresponding to those of the circumferential inner and outer surfaces of the cylindrical heater 321.

Meanwhile, referring to FIG. 5B, according to a second example, a heater 322 which surrounds the crucible 200 and the susceptor 210 comprises a plurality of heating elements 322a, which are coupled to each other, and each of which has a rectangular longitudinal section and a trapezoidal cross-section.

Referring to FIG. 5C, according to a third example, a heater 323 which surrounds the crucible 200 and the susceptor 210 comprises a plurality of heating elements 323a, which are coupled to each other, and each of which has a rod shape. In other words, the heater 323 of FIG. 5C is formed by placing the rod-shaped heating elements 323a on the sides of each other in a circular arrangement and by coupling them to each other. Each heating element 323a has a rectangular longitudinal section and a circular cross-section.

Figure 6:
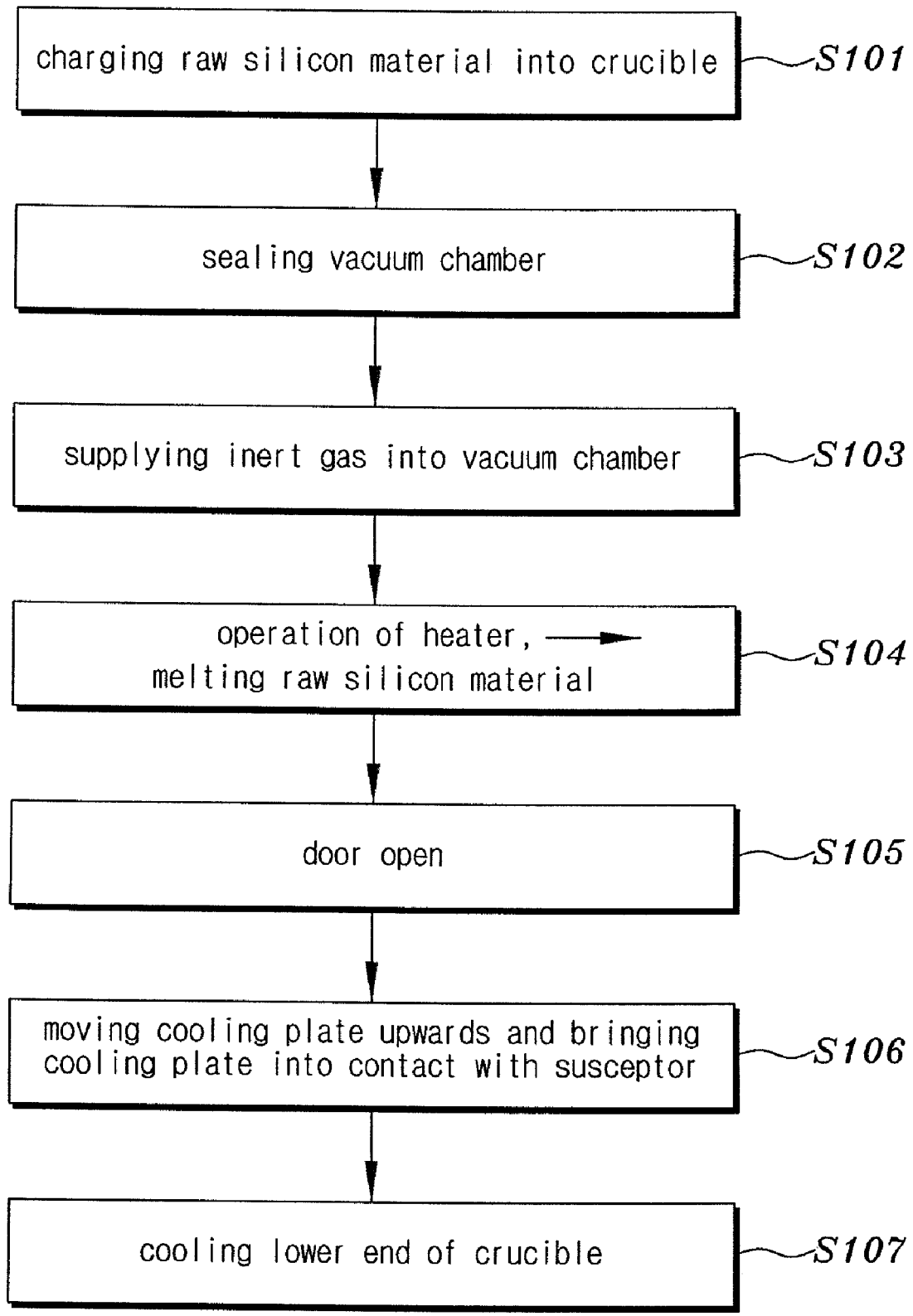
FIG. 6 is a flow chart showing an embodiment of a method of manufacturing a polycrystalline silicon ingot for solar batteries according to the present invention.

FIG. 6 is a flow chart showing an embodiment of a method of manufacturing a polycrystalline silicon ingot for solar batteries according to the present invention.

The method of manufacturing a polycrystalline silicon ingot for solar batteries according to the present invention will be explained below with reference to FIGS. 1 through 4 and 6.

At step S101, raw silicon material is charged into the crucible 200.

Thereafter, the vacuum chamber 100 and the doors 500a and 500b are closed and a vacuum is created in the vacuum chamber 100, at step S102.

Subsequently, at step S103, an inert gas such as argon (Ar) is injected into the vacuum chamber 100 to a predetermined pressure. In the present invention, while the following steps are conducted, inert gas is continuously supplied into the vacuum chamber 100 at a constant flow rate.

At step S104, the heaters 310 and 320 which are provided above and around the crucible 200 are operated to melt the raw silicon material in the crucible 200.

Thereafter, the cooling plate 400 moves upwards and opens the doors 500a and 500b or 500c through 500f, at step S105. Subsequently, the cooling plate 400 further moves upwards and approaches or comes into close contact with the lower end of the susceptor 210, at step S106.

For example, in the case of the first embodiment, the opening of the doors 500a and 500b is realized by the hinges 510a and 510b, which are respectively provided between the doors 500a and 500b and the insulation plate 120. That is, when the cooling plate 400 pushes the lower surfaces of the doors 500a and 500b and moves upwards, the two doors 500a and 500b are rotated around the hinges 510a and 510b and thus opened in a double swinging manner. Furthermore, in the present invention, the rollers 421 and 422 are provided on the corresponding surface of the cooling plate 400 which comes into contact with the lower surfaces of the doors 500a and 500b. Because of the rollers 421 and 422, when the cooling plate 400 pushes the doors 500a and 500b and moves upwards, a scratch is prevented from resulting from the contact occurring between the surfaces of the cooling plate 400 and the doors 500a and 500b.

Thereafter, at step S107, the control unit controls the heat capacity of the heaters 310 and 320 and the temperature and flow rate of refrigerant that flows through the cooling plate, so that the lower end of the crucible 200 is cooled, so that silicon crystals grow evenly from the bottom of the crucible 200 to the top thereof.

As described above, the present invention provides an apparatus for manufacturing a polycrystalline silicon ingot for solar batteries which has a door control device using a hinge and in which silicon crystals can be evenly grown from the bottom of the ingot to the top thereof.

Furthermore, in the present invention, because the door is opened using the hinge, noise is markedly reduced compared to a door control method using a motor or the like. In addition, the entire construction of the apparatus can be simplified, thus reducing the production cost.

Moreover, in the present invention, a roller is provided on a surface of a cooling plate which comes into contact with the lower surface of the door, so that scratching of the contact surface between the cooling plate and the door can be prevented.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus configured to manufacture a polycrystalline silicon ingot for solar batteries comprising a door control device using a hinge, the apparatus comprising:
    a vacuum chamber;
    a crucible in the vacuum chamber, wherein the crucible has a predetermined shape;
    a susceptor surrounding the crucible to protect the crucible;
    a support under the susceptor configured to support the susceptor;
    a heater configured to heat the crucible to melt a raw silicon material in the crucible;
    an insulation plate below the susceptor spaced apart by a predetermined distance from the susceptor, wherein the insulation plate comprises an opening;
    a cooling plate having a diameter corresponding to a diameter of the opening of the insulation plate, wherein the cooling plate is configured to move upwards through the opening of the insulation plate and come into close contact with or approaching a lower end of the susceptor to cool a lower end of the crucible;
    a cooling plate support shaft under the cooling plate to support the cooling plate;
    a cooling plate moving unit configured to actuate the cooling plate and the cooling plate support shaft;
    an inert gas supply and discharge unit configured to supply inert gas into the vacuum chamber or discharge the inert gas outside of the vacuum chamber;
    a temperature sensor configured to measure a temperature of the crucible; and
    a control unit configured to control the temperature in the crucible using an output value transmitted from the temperature sensor such that the raw silicon material is evenly melted and grown in the crucible, wherein:
        the control unit controls the inert gas supply and discharge unit such that a constant amount of inert gas is maintained in the vacuum chamber,
        the control unit is configured to control the cooling plate moving unit such that the cooling plate approaches or comes into contact with the lower end of the susceptor through the opening of the insulation plate,
        insulation plate comprises a door configured to open or close the opening of the insulation plate,
        the door comprises the hinge between the door and the insulation plate,
        the door is opened or closed by the hinge, such that after the raw silicon material is melted, the cooling plate moves upwards to cool the crucible and pushes a lower surface of the door upwards,
        the door is opened by the hinge in a swinging manner, and
        when the cooling plate approaches or comes into contact with the lower end of the susceptor, one end of the opened door leans on a corresponding surface of the cooling plate.

2. The apparatus as set forth in claim 1, further comprising:
    a scratch prevention unit configured to prevent scratches forming on contact surfaces between the cooling plate and the door when the cooling plate moves upwards and pushes the lower surface of the door.

3. The apparatus as set forth in claim 2, wherein the scratch prevention unit comprises a roller on a surface of the cooling plate which comes into contact with the lower surface of the door, so that when the cooling plate moves upwards and pushes the lower surface of the door to open the door, the roller rolls on the lower surface of the door.

4. The apparatus as set forth in claim 3, wherein:
    the door comprises a plurality of doors; and
    the roller of the scratch prevention unit comprises a plurality of rollers provided at positions corresponding to the respective doors on the surface of the cooling plate which comes into contact with the doors.

5. The apparatus as set forth in claim 1, wherein:
    the crucible is substantially at a center of the vacuum chamber; and
    the opening of the insulation plate is directly below the susceptor.

6. The apparatus as set forth in claim 1, wherein a refrigerant passage is formed in the cooling plate and the cooling plate support shaft.

7. The apparatus as set forth in claim 2, wherein:
    the crucible is substantially at a center of the vacuum chamber; and
    the opening of the insulation plate is directly below the susceptor.

8. The apparatus as set forth in claim 2, wherein a refrigerant passage is formed in the cooling plate and the cooling plate support shaft.

* * * * *